US010115811B2

(12) United States Patent
Menta et al.

(10) Patent No.: US 10,115,811 B2
(45) Date of Patent: Oct. 30, 2018

(54) VERTICAL CHANNEL SEMICONDUCTOR DEVICE WITH A REDUCED SATURATION VOLTAGE

(71) Applicant: STMICROELECTRONICS S.R.L., Agrate Brianza (IT)

(72) Inventors: Fernando Giovanni Menta, Catania (IT); Salvatore Pisano, Catania (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 15/474,825

(22) Filed: Mar. 30, 2017

(65) Prior Publication Data

US 2018/0122926 A1    May 3, 2018

(30) Foreign Application Priority Data

Oct. 27, 2016    (IT) .......................... 102016000108699

(51) Int. Cl.

| H01L 29/739 | (2006.01) |
|---|---|
| H01L 29/06 | (2006.01) |
| H01L 29/423 | (2006.01) |
| H01L 23/535 | (2006.01) |
| H01L 29/08 | (2006.01) |
| H01L 29/10 | (2006.01) |
| H01L 27/07 | (2006.01) |

(52) U.S. Cl.
CPC ........ *H01L 29/7397* (2013.01); *H01L 23/535* (2013.01); *H01L 27/0716* (2013.01); *H01L 29/0696* (2013.01); *H01L 29/0804* (2013.01); *H01L 29/1095* (2013.01); *H01L 29/4238* (2013.01)

(58) Field of Classification Search
None
See application file for complete search history.

(56) References Cited

U.S. PATENT DOCUMENTS

| 6,005,271 A | 12/1999 | Hshieh |
| 6,060,747 A | 5/2000 | Okumura et al. |
| (Continued) | | |

OTHER PUBLICATIONS

Laska et al., "1200V-Trench-IGBT Study with Square Short Circuit SOA," *Proceedings of 1998 International Symposium on Power Semiconductor Devices & ICs, Kyoto*, 1998, pp. 433-436.

*Primary Examiner* — Whitney T Moore
(74) *Attorney, Agent, or Firm* — Seed IP Law Group LLP

(57) ABSTRACT

A vertical channel semiconductor device including: a semiconductor body including a substrate having a first conductivity type and a front layer having a second conductivity type; a first portion of trench and a second portion of trench; and, within the first and second portions of trench, a corresponding conductive region and a corresponding insulating layer. The first and second portions of trench delimit laterally a first semiconductor region and a second semiconductor region, the first semiconductor region having a maximum width greater than the maximum width of the second semiconductor region. The device further includes an emitter region having the first conductivity type, which extends in the front layer and includes: a full portion, which extends in the second semiconductor region; and an annular portion, which extends in the first semiconductor region. The annular portion laterally surrounds a top region having the second conductivity type.

20 Claims, 6 Drawing Sheets

(56) References Cited

U.S. PATENT DOCUMENTS

| | | |
|---|---|---|
| 9,748,229 B2* | 8/2017 | Hikasa ................ H01L 27/0716 |
| 2002/0043684 A1 | 4/2002 | Kubo |
| 2009/0072304 A1 | 3/2009 | Adan |
| 2010/0078674 A1 | 4/2010 | Seok et al. |
| 2017/0018635 A1* | 1/2017 | Tsuyuki .............. H01L 29/7397 |
| 2018/0083130 A1* | 3/2018 | Matsuura ............ H01L 29/0696 |

* cited by examiner

VERTICAL CHANNEL SEMICONDUCTOR DEVICE WITH A REDUCED SATURATION VOLTAGE

BACKGROUND

Technical Field

The present disclosure relates to a vertical channel semiconductor device, which has a reduced saturation voltage.

Description of the Related Art

As is known, today available are so-called power transistors, such as power MOS transistors and the so-called IGBTs (Insulated-Gate Bipolar Transistors).

With reference, for example, to IGBTs, a particularly significant parameter is represented by the so-called collector-emitter saturation voltage, in brief $V_{CEsat}$. In particular, since the voltage $V_{CEsat}$ has an effect on the leakages that occur when the IGBT is on, the voltage $V_{CEsat}$ should be as low as possible.

BRIEF SUMMARY

At least one embodiment of the present disclosure is a vertical channel semiconductor device with a reduced voltage $V_{CEsat}$.

According to the disclosure a semiconductor device includes: a semiconductor body including a substrate having a first conductivity type and a front layer having a second conductivity type, said semiconductor body being delimited by a front surface;

a first trench portion extending within the semiconductor body starting from the front surface and laterally delimiting a first semiconductor region of the semiconductor body;

a second trench portion extending within the semiconductor body starting from the front surface and laterally delimiting a second semiconductor region of the semiconductor body, said first semiconductor region having a maximum width greater than a maximum width of the second semiconductor region;

a first conductive region and a first insulating layer in the first trench portion, the first insulating layer surrounding the first conductive region and contacting the front layer;

a second conductive region and a second insulating layer in the second trench portion, the second insulating layer surrounding the second conductive region and contacting the front layer;

a top region having the second conductivity type; and a first emitter region having the first conductivity type, which extends into the front layer starting from the front surface and includes:

a full portion which extends in said second semiconductor region, between the first and second trench portions; and a first annular emitter portion which extends in said first semiconductor region, in contact with said full portion and with the first and second insulation layers, said first annular emitter portion laterally surrounding the top region having the second conductivity type.

BRIEF DESCRIPTION OF THE SEVERAL VIEWS OF THE DRAWINGS

For a better understanding of the disclosure, embodiments thereof are now described, purely by way of non-limiting example with reference to the attached drawings, wherein.

DETAILED DESCRIPTION

Figure 1:
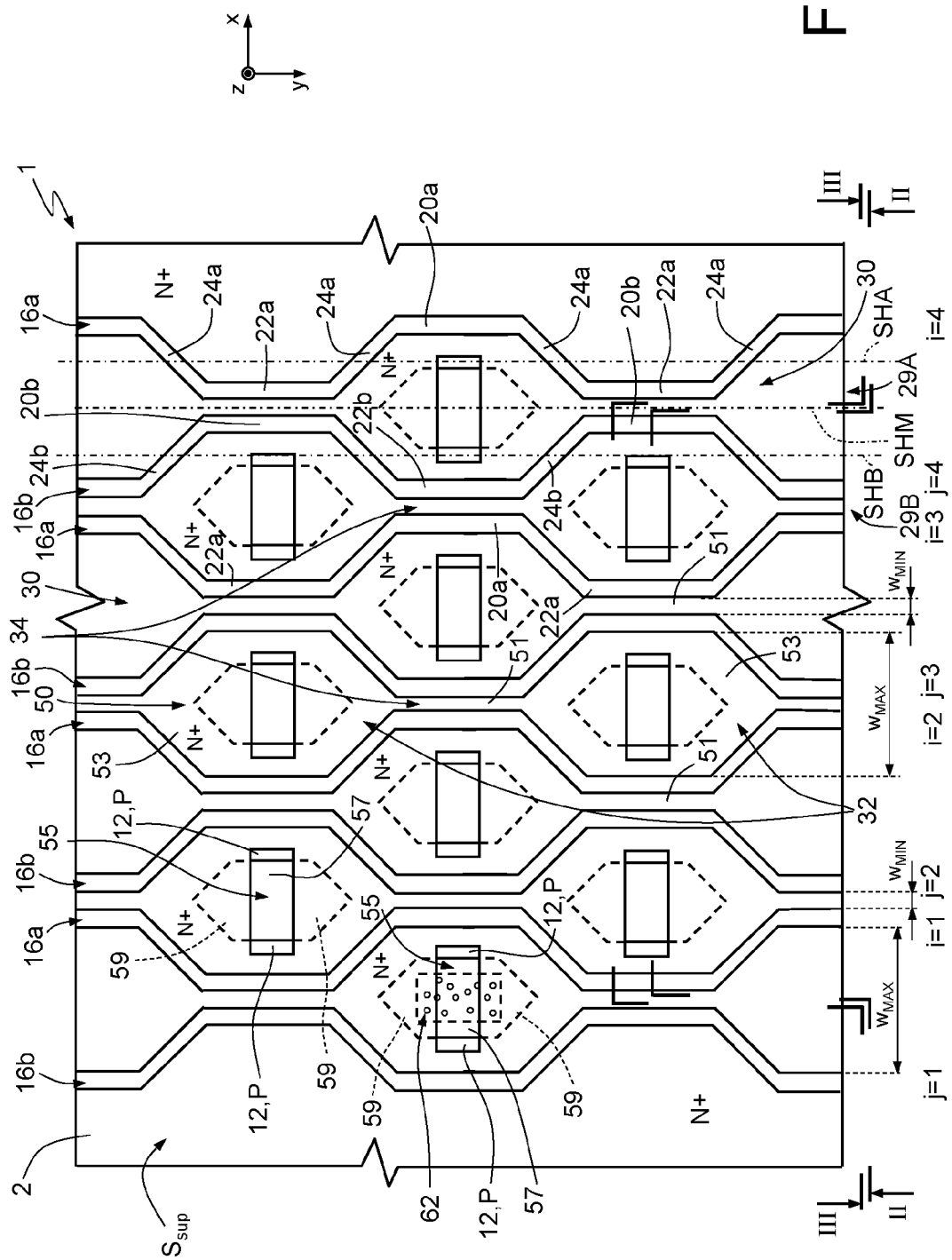
FIG. 1 is a schematic top plan view with portions removed of an embodiment of the present semiconductor device.

FIG. 1 shows a semiconductor device 1, which, without any loss of generality, forms an IGBT.

Figure 2:
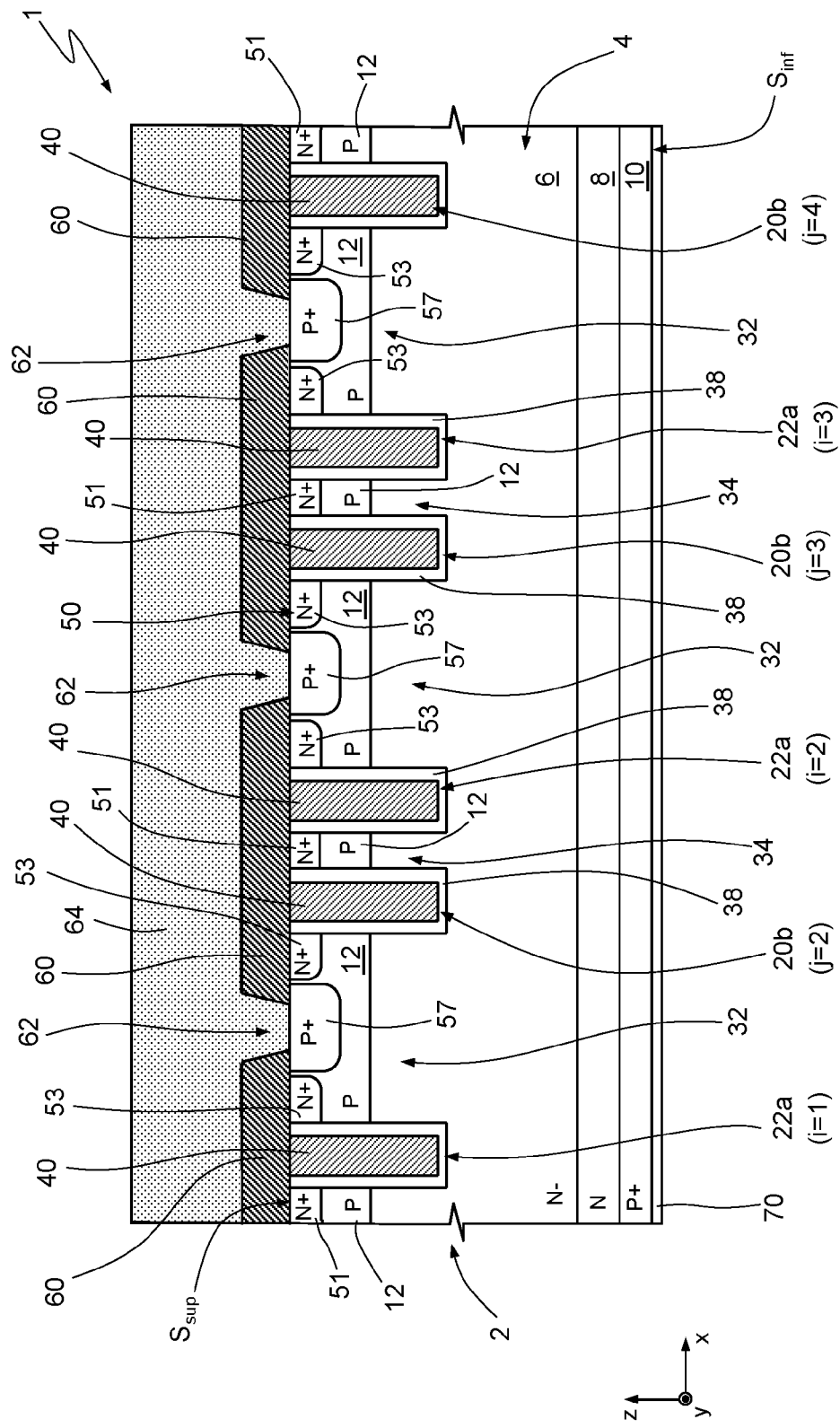
FIG. 2 is a schematic cross-sectional view of a portion of the semiconductor device illustrated in FIG. 1, taken along the line of section II-II of FIG. 1.

In detail, as illustrated also in FIG. 2, the semiconductor device 1 is formed in a die 2 of semiconductor material.

The die 2 forms a body 4 of semiconductor material (for example, silicon), which includes a substrate 6 of an N− type, extending underneath which is a first lower layer 8 of an N type, which is obtained, for example, by implantation or epitaxial growth and has a doping level higher than the doping level of the substrate 6. Extending underneath the first lower layer 8 is a second lower layer 10 of a P+ type, which forms a bottom surface $S_{inf}$ that delimits the semiconductor body 4 at the bottom. Also the second lower layer 10 may be obtained by implantation or epitaxial growth.

The semiconductor body 4 further comprises an upper layer 12 of a P type, which extends over the substrate 6. Furthermore, the upper layer 12 forms a top surface $S_{sup}$, which delimits the semiconductor body 4 at the top. Also the upper layer 12 may be obtained by implantation or epitaxial growth.

The semiconductor device 1 further comprises a plurality of trenches 16a of a first type and a plurality of trenches 16b of a second type (in particular, in FIG. 1 four trenches 16a of the first type and four trenches 16b of the second type are illustrated).

The trenches 16a, 16b of the first and second types extend in the semiconductor body 4 starting from the top surface $S_{sup}$ so as to traverse the upper layer 12 entirely as far as an upper portion of the substrate 6. Without any loss of generality, the trenches 16a, 16b of the first and second types have a same depth.

Assuming an orthogonal reference system xyz such that the plane xy is parallel to the top surface $S_{sup}$ and to the bottom surface $S_{inf}$, the trenches 16a, 16b of the first and second types are staggered along the axis x; further, the trenches 16a, 16b of the first and second types are arranged so as to be interspersed with one another in a direction parallel to the axis x. In this connection, an index i and an index j are adopted to index, respectively, the trenches 16a of the first type and the trenches 16b of the second type (with i, j=1, 2, 3, 4, where higher values correspond to higher co-ordinates along the axis x).

In greater detail, each trench 16a of the first type comprises a plurality of longitudinal portions 20a of the first type, a plurality of longitudinal portions 22a of the second type, and a plurality of transverse portions 24a.

The longitudinal portions 20a of the first type extend parallel to the axis y and have a same co-ordinate along the axis x; i.e., they are aligned to one another in a direction parallel to the axis y, without being staggered along the axis x. Furthermore, without any loss of generality, the longitudinal portions 20a of the first type have a same width (measured along the axis x), which is constant in a direction parallel to the axis y.

The longitudinal portions 22a of the second type of a trench 16a of the first type also extend parallel to the axis y and have a same co-ordinate along the axis x; i.e., they are aligned to one another in a direction parallel to the axis y, without being staggered along the axis x. Furthermore, without any loss of generality, the longitudinal portions 22a of the second type have a same width, which is constant in a direction parallel to the axis y.

In addition, given a trench 16a of the first type, the longitudinal portions 20a of the first type have a co-ordinate $x_{20a}$ corresponding to the axis x, whereas the longitudinal portions 22a of the second type have a co-ordinate $x_{22a}$ corresponding to the axis x, with $x_{22a}<x_{20a}$. Furthermore, the longitudinal portions 20a of the first type are interspersed with the longitudinal portions 22a of the second type, in a direction parallel to the axis y.

Once again without any loss of generality, each trench 16a of the first type extends along a respective longitudinal axis SHA, parallel to the axis y; further, in top plan view, the longitudinal portions 20a of the first type extend on a first side of the longitudinal axis SHA (in particular, on the right), whereas the longitudinal portions 22a of the second type extend on a second side of the longitudinal axis SHA (in particular, on the left). Furthermore, in each pair formed by a longitudinal portion 20a of the first type and by a longitudinal portion 22a of the second type that are adjacent to one another, the longitudinal portions are connected together via interposition of a corresponding transverse portion 24a, which extends in a direction transverse, but not perpendicular, to the longitudinal axis SHA.

In practice, given, for example, a first longitudinal portion 20a of the first type, this has a first end connected to a first end of a first transverse portion 24a, the second end of which is connected to one end of a first longitudinal portion 22a of the second type. Further, the first longitudinal portion 20a of the first type has a second end connected to a first end of a second transverse portion 24a, the second end of which is connected to one end of a second longitudinal portion 22a of the second type. Similar considerations apply in the case of the longitudinal portions 22a of the second type.

As regards the trenches 16b of the second type, each of them comprises a plurality of respective longitudinal portions 20b of the first type, a respective plurality of longitudinal portions 22b of the second type, and a plurality of transverse portions 24b.

In detail, given a trench 16b of the second type, the longitudinal portions 20b of the first type have a co-ordinate $x_{20b}$ corresponding to the axis x, whereas the longitudinal portions 22b of the second type have a co-ordinate $x_{22b}$ corresponding to the axis x, with $x_{22b}<x_{20b}$. Furthermore, the j-th trench 16b of the second type forms a pair of trenches 29A with the i-th (with i=j) trench 16a of the first type. Said pair of trenches 29A has a respective longitudinal axis SHM, parallel to the axis y, and the trench 16b of the second type is specular to the trench 16a of the first type with respect to the longitudinal axis SHM. Consequently, denoting by SHB the longitudinal axis of the trench 16b of the second type, it is arranged specularly to the longitudinal axis SHA of the trench 16a of the first type, if the longitudinal axis SHM is adopted as reference. Further, denoting, respectively, by $x_{SHA}$, $x_{SHB}$ and $x_{SHM}$ the co-ordinates along the axis x of the longitudinal axis SHA of the trench 16a of the first type, of the longitudinal axis SHB of the trench 16b of the second type, and of the longitudinal axis SHM of the corresponding pair of trenches 29A, we have $x_{SHB}<x_{SHM}<x_{SHA}$.

In practice, with reference once again to the pair of trenches 29A formed by the j-th trench 16b of the second type and by the i-th trench 16a of the first type, with i=j, each longitudinal portion 20b of the first type of the trench 16b of the second type faces a corresponding longitudinal portion 22a of the second type of the trench 16a of the first type, from which it is at a distance $w_{MIN}$. Furthermore, each longitudinal portion 22b of the second type of the trench 16b of the second type faces a corresponding longitudinal portion 20a of the first type of the trench 16a of the first type, from which it is at a distance $w_{MAX}$, with $w_{MIN}<w_{MAX}$.

Purely by way of example, the distance $w_{MIN}$ may be comprised between 0.05 μm and 0.5 μm, whereas the distance $w_{MAX}$ may be comprised, for example, between 2 μm and 20 μm.

As may again be seen in FIG. 1, for j>1 we have that the j-th trench 16b of the second type, in addition to forming a corresponding pair of trenches 29A, with the i-th (with i=j) trench 16a of the first type, forms a further pair of trenches 29B with the i−1-th (with i=j) trench 16a of the first type. Consequently, considering for example the j-th (with j>1) trench 16b of the second type, each longitudinal portion 20b of the first type has:
 a first side that, as mentioned previously, faces a corresponding longitudinal portion 22a of the second type of the i-th (with i=j) trench 16a of the first type, from which it is at a distance $w_{MIN}$; and further
 a second side, opposite to the first side, which faces a corresponding longitudinal portion 22a of the second type of the i−1-th (with i=j) trench 16a of the first type, from which it is at a distance $w_{MAX}$.

Furthermore, each longitudinal portion 22b of the second type has:
 a first side that, as mentioned previously, faces a corresponding longitudinal portion 20a of the first type of the i-th (with i=j) trench 16a of the first type, from which it is at a distance $w_{MAX}$; and
 a second side, opposite to the first side, which faces a corresponding longitudinal portion 20a of the first type of the i−1-th (with i=j) trench 16a of the first type, from which it is at a distance $w_{MIN}$.

In practice, the trenches illustrated in FIG. 1 form a sort of honeycomb structure. More in particular, each pair of adjacent trenches delimits a corresponding region 30 of the die 2, referred to in what follows as internal region 30. In turn, the internal region 30 comprises a number of regions 32 of a first type, referred to in what follows as "extended regions 32", and a number of regions 34 of a second type, referred to in what follows as "reduced regions 34".

Without any loss of generality, each of the extended regions 32 and of the reduced regions 34 is symmetrical with respect to the longitudinal axis SHM of the pair of trenches that delimits it. Furthermore, in top plan view, the extended regions 32 have a hexagonal shape, whereas the reduced regions 34 have a rectangular shape, elongated in a direction parallel to the axis y.

Each of the extended regions 32 and reduced regions 34 comprises a corresponding portion of the substrate 6 and a corresponding portion of the upper layer 12, as described in greater detail hereinafter.

As may be seen in FIG. 2, within each trench, both that of the first type and that of the second type, there are present a corresponding insulating layer 38 (not illustrated in FIG. 1) of dielectric material (for example, oxide), and a corresponding gate region 40 (not illustrated in FIG. 1), formed by conductive material (for example, polysilicon). In particular, the insulating layer 38 is arranged more externally, whereas the gate region 40 is arranged more internally so as to be coated laterally and at the bottom by the insulating layer 38, which coats the side walls and the bottom of the trench. Both the gate region 40 and the insulating layer 38 give out onto the top surface $S_{sup}$; further, the gate region 40 extends to a depth greater than the maximum depth to which the upper layer 12 extends.

In greater detail, albeit not illustrated, the gate region 40 follows, in top plan view, the profile of the respective trench, and thus comprises respective longitudinal and transverse portions. Equivalently, the thickness of the insulating layer 38 is to a first approximation invariant along the trench.

Once again with reference to the internal regions 30, present in each of them is an emitter region 50 of an N+ type, which extends into the upper layer 12 starting from the top surface $S_{sup}$.

In particular, considering an internal region 30 and the corresponding emitter region 50, the latter comprises, for each reduced region 34 of the internal region 30 considered, a corresponding full portion 51, which extends between upper portions of the trench 16a of the first type and of the trench 16b of the second type that delimit the reduced region 34, contacting the insulating layers 38 contained in these two trenches. Furthermore, the emitter region 50 comprises, for each extended region 32, a corresponding annular portion 53, which has precisely an annular shape, in top plan view. This annular portion 53 extends between upper portions of the trench 16a of the first type and of the trench 16b of the second type that delimit the extended region 32, contacting, on the outer side thereof, the insulating layers 38 contained in these two trenches.

In greater detail, as regards the trench portions contacted by the full portion 51 and by the annular portion 53, if the internal region 30 is delimited by the i-th trench 16a of the first type and by the j-th trench 16b of the second type, and if i=j, we have that:
each reduced region 34 is delimited by a longitudinal portion 22a of the second type of the trench 16a of the first type and by a longitudinal portion 20b of the first type of the trench 16b of the second type, extending between which, without solution of continuity, are the corresponding full portion 51 of the emitter region 50 and an underlying portion of the upper layer 12; and
each extended region 32 is delimited by a longitudinal portion 22b of the second type of the trench 16b of the second type and by a longitudinal portion 20a of the first type of the trench 16a of the first type, which are contacted by the corresponding annular portion 53 of the emitter region 50;
instead, if j=i+1, we have that:
each reduced region 34 is delimited by a longitudinal portion 20a of the first type of the trench 16a of the first type and by a longitudinal portion 22b of the second type of the trench 16b of the second type, extending between which, without solution of continuity, are the corresponding full portion 51 of the emitter region 50 and an underlying portion of the upper layer 12; and
each extended region 32 is delimited by a longitudinal portion 22a of the second type of the trench 16a of the first type and by a longitudinal portion 20b of the first type of the trench 16b of the second type, which are contacted by the corresponding annular portion 53 of the emitter region 50.

From a mathematical standpoint, within each reduced region 34 the corresponding full portion 51 of the emitter region 50 forms a simply connected region, i.e., without any holes.

Present within each extended region 32 is a corresponding body-contact region 55 of a P+ type, which has a doping level higher than the doping level of the upper layer 12.

Each body-contact region 55 comprises a surface portion 57 and a pair of buried portions 59. Furthermore, without any loss of generality, each body-contact region 55 has a hexagonal shape, in top plan view.

Figure 3:
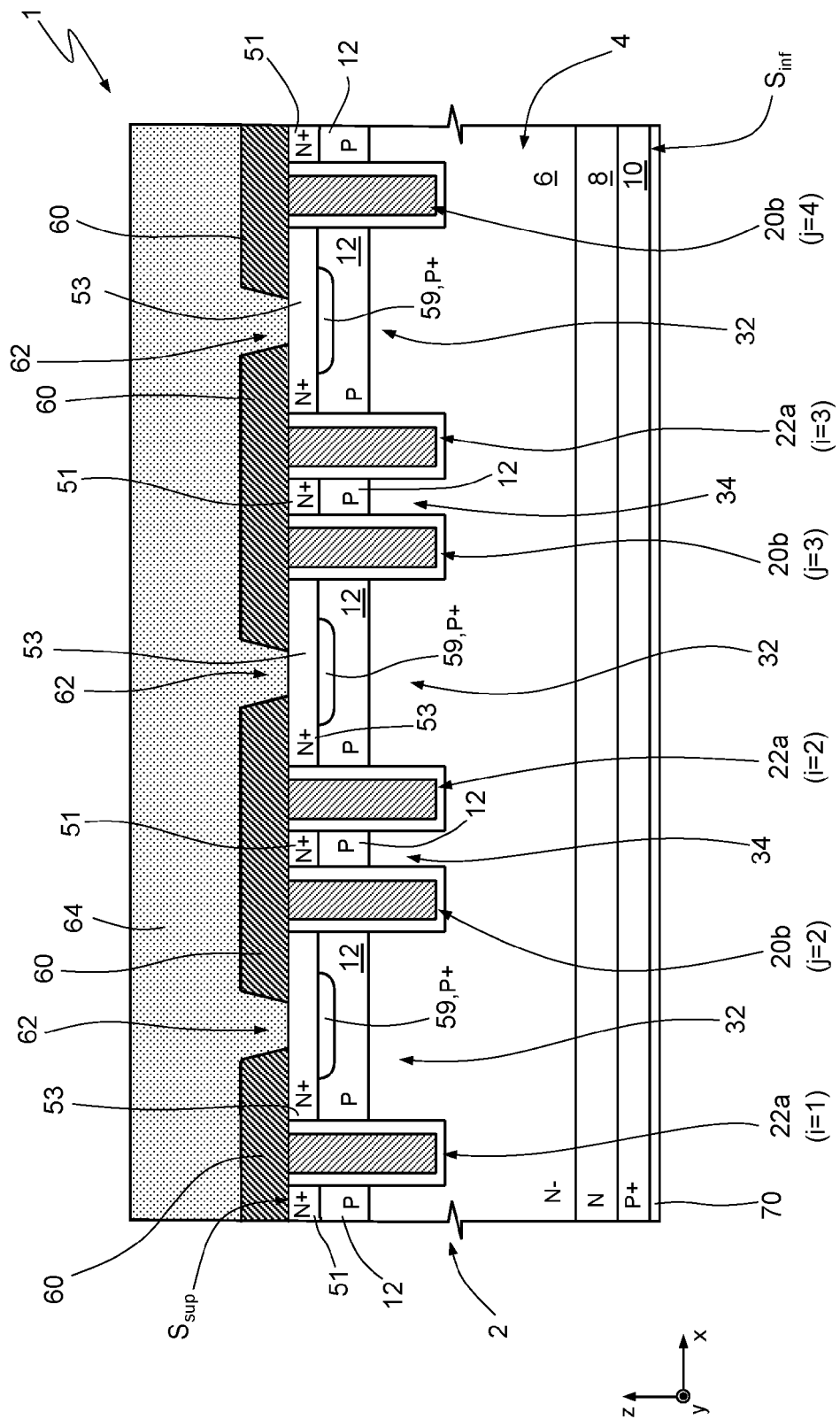
FIG. 3 is a schematic cross-sectional view of a portion of the semiconductor device illustrated in FIG. 1, taken along the line of section III-III of FIG. 1.

The surface portion 57 extends into the upper layer 12 starting from the top surface $S_{sup}$; in particular, the surface portion 57 extends in the portion of upper layer 12 that is delimited laterally of the inner side of the corresponding annular portion 53 of the emitter region 50. The two buried portions 59 extend within the second epitaxial layer 12, on opposite sides of the surface portion 57, to which they are connected, and at a distance from the top surface $S_{sup}$. In particular, as may be seen in FIG. 3, the buried portions 59 extend underneath corresponding parts of the annular portion 53 of the emitter region 50, with which they are in direct contact. These parts of the annular portion 53 of the emitter region 50 contact laterally the surface portion 57 of the body-contact region 55, with respect to which they are thus laterally staggered. Without any loss of generality, the buried portions 59 of the body-contact region 55 extend to a maximum depth equal to the maximum depth reached by the surface portion 57 of the body-contact region 55.

As may again be seen in FIGS. 1 and 2, the surface portion 57 of the body-contact region 55 does not occupy entirely the space delimited by the inner side of the corresponding annular portion 53 of the emitter region 50. Consequently, a pair of top parts of the upper layer 12 gives out onto the top surface $S_{sup}$; each of said parts is arranged on opposite sides of the surface portion 57 of the body-contact region 55 and is arranged between the surface portion 57 of the body-contact region 55 and the corresponding annular portion 53 of the emitter region 50. Albeit not illustrated, embodiments are, however, possible in which the surface portion 57 of the body-contact region 55 occupies entirely the space delimited by the inner side of the corresponding annular portion 53 of the emitter region 50, in which case within the extended region 32 there are no parts of the upper layer 12 that give out onto the top surface $S_{sup}$.

The semiconductor device 1 further comprises a dielectric region 60, which is formed, for example, by oxide and extends over the top surface $S_{sup}$, to form a plurality of windows 62.

Each window 62 gives out onto at least part of the surface portion 57 of a corresponding body-contact region 55. A representation of the extension, in top plan view, of a window 62 is provided by way of example in one of the extended regions 32 illustrated in FIG. 1; in particular, the shape of the window 62 at the height of the top surface $S_{sup}$ is represented dotted.

As illustrated in the dotted representation appearing in FIG. 1, each window 62 also gives out onto portions of the parts of the annular portion 53 that overlie the buried portions 59 of the body-contact region 55.

The semiconductor device 1 further comprises a top metallization 64, which overlies the dielectric region 60 and extends within the windows 62 so as to contact the surface portions 57 of the body-contact regions 55 and the emitter regions 50 (in particular, the aforementioned portions of the parts of annular portions 53 that overlie the buried portions 59 of the body-contact regions 55).

Operatively, the emitter regions 50 are arranged in electrical contact with one another by the top metallization 64, which further arranges them in electrical contact with the body-contact regions 55. In this way, the emitter and the base of the parasitic transistor of an NPN type formed by the emitter region, by the body region, and by the substrate are shorted, and this the parasitic transistor may not be triggered. Once again in connection with said parasitic transistor, the body-contact region 55 is optional; however, its presence enables reduction of the base resistance of the parasitic transistor.

The semiconductor device 1 is a vertical channel device, and in particular is an IGBT. In fact, the channel is formed in the portions of the upper layer 12 arranged in contact with the insulating layers 38. In this connection, the gate regions 40 are biased by a corresponding gate metallization (not illustrated). Furthermore, the second lower layer 10 forms the so-called collector of the IGBT; extending underneath the second lower layer 10 is a bottom metallization 70.

In practice, patterned within the extended region 32 are the emitter region and the body-contact region; instead, in the reduced regions 34 there is no patterning, on account of the short distance between the trenches. Consequently, in the reduced regions 34 the electrical connections are based upon what occurs in the adjacent extended region 32.

This having been said, the present applicant has noted how, within the reduced regions 34, there occurs a considerable increase in the concentration of carriers (electrons/holes), on account of the short distance between the trenches; this leads to an increase in the conductivity of the so-called drift region, which is formed by the portions of the substrate 6 that contact the insulating layers 38.

For instance, assuming that $w_{MIN}$ is equal to 0.2 µm, we find that, when the semiconductor device 1 is on, the concentration of holes within a reduced region 34 is approximately four times higher than the concentration of holes present in an extended region 32.

In practice, the short distance between the trenches causes a local increase in the carrier concentration, thus reducing the leakages to which the semiconductor device 1 is subject when it is on, and thus reducing the so-called $V_{CEsat}$. In particular, the $V_{CEsat}$ decreases as the distance $w_{MIN}$ decreases. Furthermore, the reduction in $V_{CEsat}$ is obtained without the need to resort to marked miniaturization technologies. Once again, the reduction in $V_{CEsat}$ does not lead to an increase in the so-called switch-off energy (referred to briefly as $E_{off}$), given the same thickness of the substrate 6.

Figure 4:
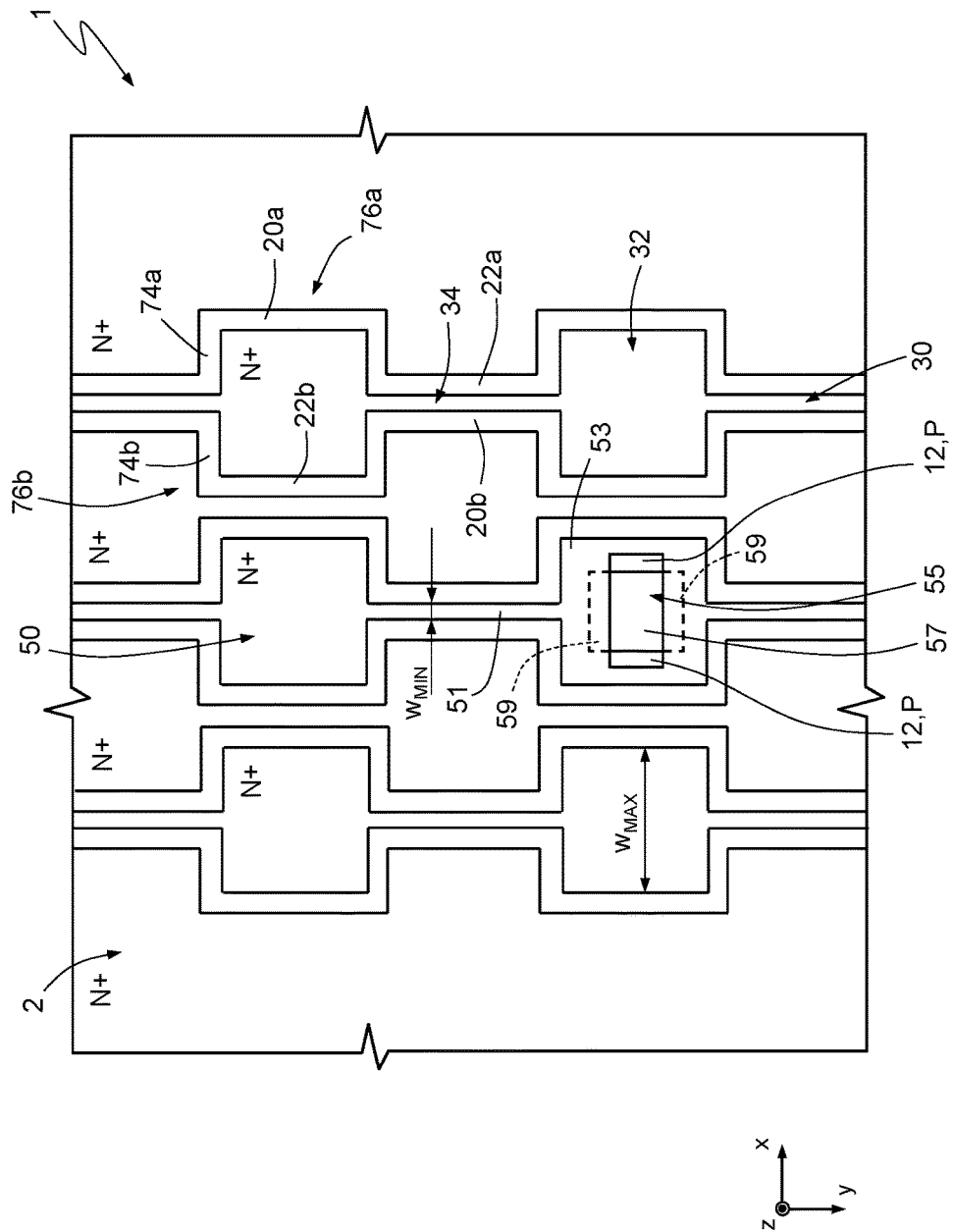
FIGS. 4, 5, and 6 are schematic top plan views with portions removed of embodiments of the present semiconductor device.

A different embodiment is illustrated in FIG. 4, where illustrated in detail for simplicity is just one of the extended regions 32.

In particular, in FIG. 4 the trenches of the first and second types are designated by 76a and 76b, respectively; further, the transverse portions (designated by 74a) of the trenches 76a of the first type and the transverse portions (designated by 74b) of the trenches 76b of the second type are perpendicular, instead of transverse, with respect to the longitudinal portions of aforesaid trenches. In this way, the extended region, designated once again by 32, have a rectangular or square shape in top plan view.

As illustrated, for simplicity of representation, with reference to just one extended region 32, the shape of the body-contact regions 55 may, for example, be rectangular or square, in top plan view; likewise, the annular portions 53 of the emitter regions 50 may have the shape of a hollow rectangle/square.

Figure 5:
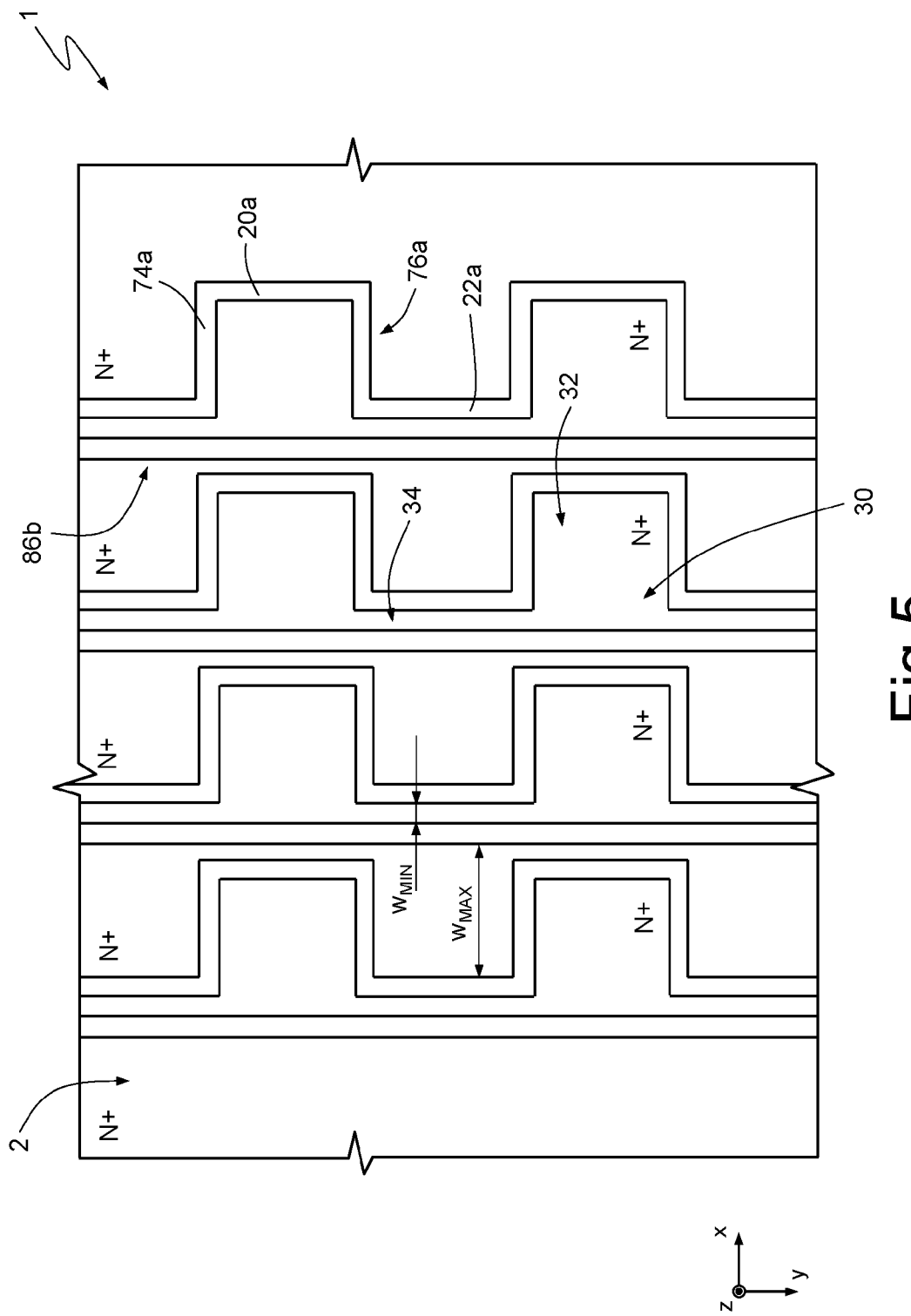

A further embodiment is illustrated in FIG. 5, in which for simplicity just the trenches are shown; i.e., the details present within the extended region 32 are not represented.

In particular, in FIG. 5 the trenches 76a of the first type are like the ones illustrated in FIG. 4, whereas the trenches (designated by 86b) of the second type are rectilinear. Consequently, the trenches of each pair are no longer symmetrical.

Figure 6:
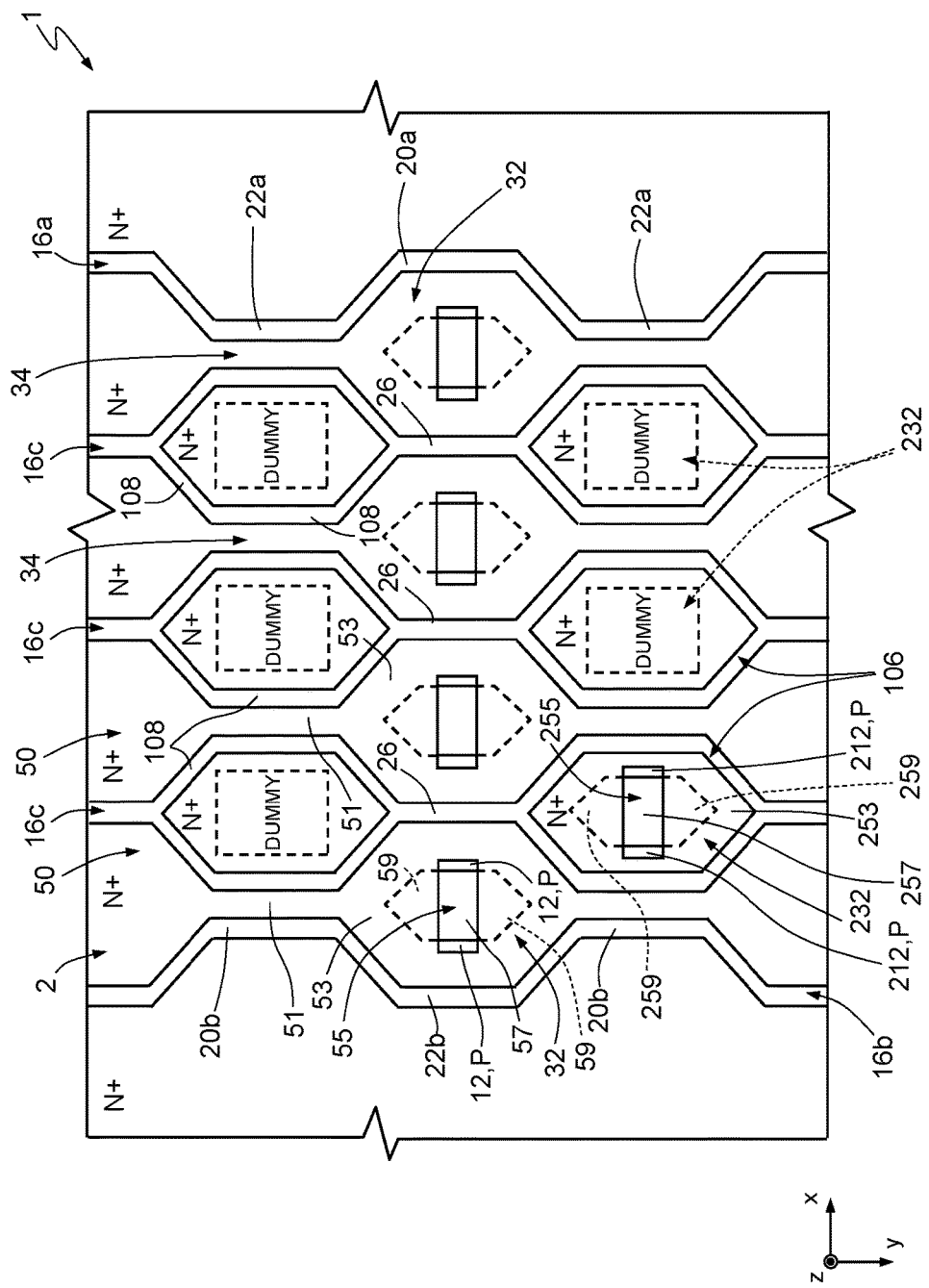

A further embodiment is illustrated in FIG. 6, which is described in what follows with reference to just the differences with respect to what is illustrated in FIG. 1.

In detail, visible in the embodiment illustrated in FIG. 6 are a trench 16a of the first type and a trench 16b of the second type, between which there extend three trenches 16c of a third type.

In greater detail, each trench 16c of the third type includes a plurality of respective longitudinal portions 26 and one or more annular portions 106, referred to in what follows as "trench rings 106"; the longitudinal portions 26 extend parallel to the axis y, interspersing with the trench rings 106.

Without any loss of generality, in the plane xy the trench rings 106 have a hexagonal shape and each is connected, at two opposite vertices thereof, to two longitudinal portions 26. In other words, each trench 16c of the third type forms, at each trench ring 106 thereof, two branches, which then join up again. In addition, each trench ring 106 is delimited by six corresponding lateral trench portions 108.

Given a trench 16c of the third type, each trench ring 106 is aligned, in a direction parallel to the axis x, to corresponding trench rings 106 of the other trenches 16c of the third type, so as to form a row of trench rings 106 (in FIG. 6, each row comprises three rings). Furthermore, given each trench ring 106 of a row, the two lateral trench portions 108 that extend parallel to the axis y are aligned, in said direction parallel to the axis x, to a longitudinal portion 20b of the first type of the trench 16b of the second type and to a longitudinal portion 22a of the second type of the trench 16a of the first type.

Likewise, given a trench 16c of the third type, each longitudinal portion 26 is aligned, in a direction parallel to the axis x, to corresponding longitudinal portions 26 of the other trenches 16c of the third type so as to form a corresponding row of longitudinal portions 26; further, each longitudinal portion 26 is aligned, in the aforementioned direction parallel to the axis x, to a corresponding longitudinal portion 22b of the second type of the trench 16b of the second type and to a corresponding longitudinal portion 20a of the first type of the trench 16a of the first type.

In practice, pairs of longitudinal portions 26 that are adjacent and belong to a same row of longitudinal portions delimit corresponding extended regions 32, of the type described previously. Likewise, longitudinal portions 26 that are adjacent and aligned, in a direction parallel to the axis x, to longitudinal portions of the trenches 16a, 16b of the first and second types form with the latter corresponding extended region 32.

Pairs of lateral trench portions 108 oriented parallel to the axis y and belonging to adjacent trenches 16c of the third type delimit corresponding reduced regions 34. Furthermore, lateral trench portions 108 oriented parallel to the axis y and adjacent to longitudinal portions of trenches 16a, 16b of the first and second types form with the latter corresponding reduced regions 34.

In addition, each trench ring 106 may delimit a corresponding dummy region 232 (by way of example, just one dummy region 232 is illustrated in detail in FIG. 6, where, however, other areas in which corresponding dummy regions 232 may be formed are denoted by the term "dummy").

Without any loss of generality, the dummy region 232 is the same as, but for possible dimensional variations, the extended region 32 and thus comprises: a corresponding body-contact region (designated by 255), which in turn comprises a respective surface portion (designated by 257) and a pair of buried portions (designated by 259); and a respective annular portion of an emitter region (designated by 253). However, the dummy region 232 is entirely surrounded by the corresponding trench ring 106, and thus its own annular portion 253 does not contact any full portion 51 of an emitter region 50. In addition, even though not visible in FIG. 6, the dummy region 232 does not underlie a corresponding window 62, but rather is entirely overlaid by the dielectric region 60. Consequently, the top metallization 64 is separate from the surface portion 257 of the body-contact region 255 and from the annular portion 253 of the emitter region, which contact the dielectric region 60. In other words, the dielectric region 60 overlies entirely each trench ring 106 in which a dummy region is formed.

The presence of the (optional) dummy regions enables improvement of protection in regard to possible short circuits.

The advantages that the present semiconductor device affords emerge clearly from the foregoing discussion. In particular, the present semiconductor device is characterized by a reduced voltage $V_{CEsat}$ and may be manufactured with traditional technologies.

Finally, it is clear that modifications and variations may be made to the present semiconductor device, without thereby departing from the scope of the present disclosure.

In general, as explained previously, the shape of the trenches may vary with respect to what has been described. Consequently, the shapes of the extended regions and the shapes of the reduced regions may vary provided that the extended regions have in any case a maximum width, measured along the axis x, greater than the maximum width of the reduced regions.

Likewise, the shape of the annular portions of the emitter regions may vary with respect to what has been described, as likewise the shape of the body-contact regions and the shape of the windows. Furthermore, within each extended region, the shape of the top parts of the upper layer (if present) that give out onto the top surface may vary.

Within the trenches, it is possible for the gate region 40 to have a different shape and/or for there to be present, in a same trench, more than one gate region; for example, in each trench two gate regions may be present, separated by a corresponding dielectric spacer.

It is further possible for the second lower layer 10 to be of an N type, instead of a P type, in which case the semiconductor device forms a MOS power transistor, instead of an IGBT.

As regards the presence of possible dummy regions, one or more of them may underlie corresponding windows, in which case the corresponding surface portions of the body-contact regions contact the top metallization so as to form corresponding active cells.

In addition, it is possible for all the doping types to be reversed with respect to what has been described, also with reference to the MOS transistor.

Finally, embodiments are possible in which only portions of the trenches (and consequently also the corresponding insulating layers and the corresponding gate regions) follow the profiles described. It is thus possible, given a trench, for just one portion thereof to delimit, together with the portion of another trench adjacent thereto, an extended region and a reduced region that communicate with one another, i.e., that share the emitter region.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A vertical channel semiconductor device comprising:
   a semiconductor body including a substrate having a first conductivity type and a front layer having a second conductivity type, said semiconductor body being delimited by a front surface;
   a first trench portion extending within the semiconductor body starting from the front surface and laterally delimiting a first semiconductor region of the semiconductor body;
   a second trench portion extending within the semiconductor body starting from the front surface and laterally delimiting a second semiconductor region of the semiconductor body, said first semiconductor region having a maximum width greater than a maximum width of the second semiconductor region;
   a first conductive region and a first insulating layer in the first trench portion, the first insulating layer surrounding the first conductive region and contacting the front layer;
   a second conductive region and a second insulating layer in the second trench portion, the second insulating layer surrounding the second conductive region and contacting the front layer;
   a top region having the second conductivity type; and
   a first emitter region having the first conductivity type, which extends into the front layer starting from the front surface and includes:
      a full portion which extends in said second semiconductor region, between the first and second trench portions; and
      a first annular emitter portion which extends in said first semiconductor region, in contact with said full portion and with the first and second insulation layers, said first annular emitter portion laterally surrounding the top region having the second conductivity type.

2. The semiconductor device according to claim 1, wherein the maximum width of the first semiconductor region is comprised between 2 µm and 20 µm; and the maximum width of the second semiconductor region is comprised between 0.05 µm and 0.5 µm.

3. The semiconductor device according to claim 1, further comprising a first body-contact region having the second conductivity type, which has a doping level higher than the doping level of the front layer and comprises a first surface portion, which forms said top region and extends into the semiconductor body starting from the front surface, in contact with the front layer.

4. The semiconductor device according to claim 3, wherein said first body-contact region further comprises a buried portion, which contacts the surface portion and extends in the front layer underneath said first annular emitter portion and directly contacts the first annular emitter portion.

5. The semiconductor device according to claim 3, further comprising:
   a dielectric region arranged on top of the front surface; and a front metallization which extends through the dielectric region so as to contact said surface portion of the first body-contact region and said first annular emitter portion of the first emitter region.

6. The semiconductor device according to claim 5, wherein one of said first and second trench portions comprises an annular trench portion and a longitudinal trench portion connected together; and wherein said annular trench portion has a closed shape and has an outer side that delimits said second semiconductor region, said longitudinal trench portion delimiting said first region laterally.

7. The semiconductor device according to claim 6, further comprising:
   a second emitter region having the first conductivity type, which extends into the front layer starting from the front surface and comprises a second annular emitter portion, which extends in said annular trench portion; and
   a second body-contact region having the second conductivity type, which has a doping level higher than the doping level of the front layer and comprises a second surface portion, which extends into the semiconductor body starting from the front surface, in contact with the front layer, and is surrounded laterally by the second annular emitter portion of the second emitter region.

8. The semiconductor device according to claim 7, wherein said dielectric region contacts the second surface portion of the second body-contact region and the second annular emitter portion of the second emitter region.

9. The semiconductor device according to claim 1, wherein:
   said first trench portion comprises:
      a first longitudinal portion and a second longitudinal portion, which extend in a first direction and are laterally staggered in a second direction, perpendicular to the first direction; and
      a transverse portion, which extends in a direction transverse to the first direction and connects the first and second longitudinal portions;
   said first longitudinal portion delimits, together with said transverse portion, said first semiconductor region; and
   said second longitudinal portion delimits the second semiconductor region.

10. The semiconductor device according to claim 9, wherein, in a plane parallel to said first and second directions, the first semiconductor region has substantially a shape chosen from: a hexagonal shape, a rectangular shape, or a square shape; and wherein, in said plane, the second semiconductor region has substantially a rectangular shape.

11. The semiconductor device according to claim 10, comprising a plurality of trenches separated from one another; wherein:
   the plurality of trenches includes the first and second trench portions;
   pairs of adjacent trenches delimit hexagonal regions and rectangular regions, one of said hexagonal regions forming said first semiconductor region, one of said rectangular regions forming said second semiconductor region; and
   said hexagonal regions are arranged, in said plane, according to a honeycomb pattern.

12. The semiconductor device according to claim 1, wherein said semiconductor body further comprises a lower layer having the second conductivity type, said substrate being arranged between the front layer and the lower layer.

13. A vertical channel semiconductor device comprising:
   a semiconductor body including a substrate having a first conductivity type and a front layer having a second conductivity type;
   first and second trenches extending within the semiconductor body, the first and second trenches laterally delimiting opposite sides of a first semiconductor region of the semiconductor body and laterally delimiting opposite sides of a second semiconductor region of the semiconductor body, the first semiconductor region having a maximum width greater than a maximum width of the second semiconductor region, wherein the minimum width is less than 0.5 µm;
   a first conductive region and a first insulating layer in the first trench, the first insulating layer surrounding the first conductive region and contacting the semiconductor body;
   a second conductive region and a second insulating layer in the second trench, the second insulating layer surrounding the second conductive region and contacting the semiconductor body;
   a first emitter region having the first conductivity type, which extends into the front layer and includes:
      a full portion which extends in said second semiconductor region, between the first and second trenches; and
      a first annular emitter portion which extends in said first semiconductor region, in contact with said full portion and with the first and second insulation layers.

14. The semiconductor device according to claim 13, further comprising a first body-contact region having the second conductivity type, which has a doping level higher than the doping level of the front layer and comprises a first surface portion, which extends into the front layer, and a buried portion that contacts the surface portion and extends in the front layer underneath said first annular emitter portion and directly contacts the first annular emitter portion.

15. The semiconductor device according to claim 14, further comprising:
   a dielectric region arranged on top of the front layer; and
   a front metallization which extends through the dielectric region so as to contact said surface portion of the first body-contact region and said first annular emitter portion of the first emitter region.

16. The semiconductor device according to claim 13, wherein:
   said first trench comprises:
      a first longitudinal portion and a second longitudinal portion, which extend in a first direction and are laterally staggered in a second direction, perpendicular to the first direction; and
      a transverse portion, which extends in a direction transverse to the first direction and connects the first and second longitudinal portions;
   said first longitudinal portion delimits, together with said transverse portion, said first semiconductor region; and
   said second longitudinal portion delimits the second semiconductor region.

17. The semiconductor device according to claim 13, wherein, in a plane parallel to said first and second directions, the first semiconductor region has substantially a shape chosen from: a hexagonal shape, a rectangular shape, or a square shape; and wherein, in said plane, the second semiconductor region has substantially a rectangular shape.

18. An insulated gate bipolar transistor, comprising:
a semiconductor substrate having a first conductivity type;
a front semiconductor layer having a second conductivity type on a first side of the substrate;
a back semiconductor layer having the second conductivity type on a second side of the substrate;
first and second trenches extending within the front semiconductor layer and the substrate, the first and second trenches laterally delimiting opposite sides of a first semiconductor region of the front semiconductor layer and laterally delimiting opposite sides of a second semiconductor region of the front semiconductor layer, the first semiconductor region having a maximum width greater than a maximum width of the second semiconductor region;
a first conductive region and a first insulating layer in the first trench, the first insulating layer surrounding the first conductive region and contacting the front semiconductor layer and the substrate;
a second conductive region and a second insulating layer in the second trench, the second insulating layer surrounding the second conductive region and contacting the front semiconductor layer and the substrate;
a first emitter region having the first conductivity type, which extends into the front semiconductor layer and includes:
 a full portion which extends in said second semiconductor region between the first and second trenches; and
 a first annular emitter portion which extends in said first semiconductor region, in contact with said full portion and with the first and second insulation layers, wherein the first trench comprises an annular trench portion and a longitudinal trench portion that are connected together; and wherein said annular trench portion has a closed shape and has an outer side that delimits said second semiconductor region, said longitudinal trench portion delimiting said first region laterally.

19. The insulated gate bipolar transistor according to claim 18, further comprising a first body-contact region having the second conductivity type, which has a doping level higher than the doping level of the front layer and comprises a first surface portion, which forms said top region and extends into, and contacts, the front semiconductor layer and a buried portion, which contacts the surface portion and extends in the front semiconductor layer underneath said first annular emitter portion and directly contacts the first annular emitter portion.

20. The insulated gate bipolar transistor according to claim 19, further comprising:
a dielectric region arranged on top of the front semiconductor layer; and
a front metallization which extends through the dielectric region so as to contact said surface portion of the first body-contact region and said first annular emitter portion of the first emitter region.

* * * * *